US009606865B2

(12) United States Patent
Yang et al.

(10) Patent No.: US 9,606,865 B2
(45) Date of Patent: Mar. 28, 2017

(54) METHOD AND APPARATUS FOR CONFIGURING A MEMORY DEVICE

(71) Applicant: SanDisk Technologies Inc., Plano, TX (US)

(72) Inventors: Nian Yang, Mountain View, CA (US); Abhijeet Manohar, Bangalore (IN); Daniel Edward Tuers, Kapaa, HI (US)

(73) Assignee: SanDisk Technologies LLC, Plano, TX (US)

( * ) Notice: Subject to any disclaimer, the term of this patent is extended or adjusted under 35 U.S.C. 154(b) by 76 days.

(21) Appl. No.: 14/705,482

(22) Filed: May 6, 2015

(65) Prior Publication Data
US 2016/0246672 A1    Aug. 25, 2016

(30) Foreign Application Priority Data

Feb. 23, 2015 (IN) .............................. 833/CHE/2015

(51) Int. Cl.
  *G11C 29/00*  (2006.01)
  *G06F 11/10*  (2006.01)
  (Continued)

(52) U.S. Cl.
  CPC .......... *G06F 11/1068* (2013.01); *G06F 3/064* (2013.01); *G06F 3/0619* (2013.01);
  (Continued)

(58) Field of Classification Search
  None
  See application file for complete search history.

(56) References Cited

U.S. PATENT DOCUMENTS 6,325,293 B1 * 12/2001 Moreno ................. G06Q 20/32
  235/380
7,200,066 B2 * 4/2007 Krenzke ................ G11C 16/30
  365/189.09

(Continued)

OTHER PUBLICATIONS

International Search Report and Written Opinion for corresponding Application No. PCT/US2015/061895 mailed Feb. 16, 2016.

*Primary Examiner* — Daniel McMahon
(74) *Attorney, Agent, or Firm* — Brinks Gilson & Lione

(57) ABSTRACT

Apparatus and methods implemented therein use an ECC procedure to verify and correct errors in data corresponding to pre-programmed configuration data. Verification and correction is performed in a memory system comprising a non-volatile memory (NVM) and a read only memory (ROM). The NVM comprises a plurality of memory pages. On detecting a power-on reset (POR) command at the memory system, a determination is made whether the memory system has previously received the POR command from a host. When it is determined that the memory system has not previously received the POR command from the host, pre-programmed configuration data is read from the ROM and the memory system is initialized using the pre-programmed configuration data. An error correction code (ECC) is generated for the pre-programmed configuration data and the pre-programmed configuration data including the ECC is store in one of the plurality of pages of the NVM memory.

21 Claims, 8 Drawing Sheets

(51) Int. Cl.
    *G11C 29/52*     (2006.01)
    *G06F 3/06*     (2006.01)
    *G11C 7/20*     (2006.01)
    *G11C 29/04*     (2006.01)

(52) U.S. Cl.
    CPC ............ *G06F 3/0679* (2013.01); *G11C 29/52* (2013.01); *G11C 29/78* (2013.01); *G11C 7/20* (2013.01); *G11C 2029/0407* (2013.01); *G11C 2029/0411* (2013.01)

(56) References Cited

U.S. PATENT DOCUMENTS

| | | | |
|---|---|---|---|
| 7,529,969 B1 * | 5/2009 | Patel | G06F 11/1068 714/6.1 |
| 2005/0198547 A1 * | 9/2005 | Morse | G06F 1/26 713/330 |
| 2010/0299563 A1 * | 11/2010 | Stachler | H01R 13/6456 714/39 |
| 2013/0132652 A1 | 5/2013 | Wood et al. | |
| 2014/0281769 A1 * | 9/2014 | Ohshima | G11C 29/42 714/721 |

\* cited by examiner

METHOD AND APPARATUS FOR CONFIGURING A MEMORY DEVICE

CROSS-REFERENCE TO RELATED APPLICATIONS

This application claims the benefit of Indian Application No. 833/CHE/2015, filed on Feb. 23, 2015, which is hereby incorporated by reference herein in its entirety.

TECHNICAL FIELD

This application relates generally to mitigating corruption of configuration parameters for a storage device. More specifically, this application relates to using an ECC procedure to verify and correct errors in data corresponding to the pre-programmed configuration data.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, is neither expressly nor impliedly admitted as prior art against the present disclosure.

Consumers are increasingly replacing their single function devices like cell phones with multi-function devices like smart phones, tablet computers and multi-media players. Consumers demand that their multi-function devices perform increasingly complex tasks. In response to this demand, the market place has produced a wide range of applications. Consumers download these applications from online stores. It is commonplace to find multi-function devices with hundreds of applications and games. Storing these applications requires memory.

Memory manufacturers have responded by designing solid state drives with large memory storage capacities. It is commonplace to find multi-function devices with 32, 64 and 128 Gigabits of memory. To manage the memory, a solid state drive is often equipped with its own processor and software. The processor executes the software to configure the solid state drive. Device manufacturers may embed a solid state drive into a consumer device. Thus, if the solid state drive malfunctions, removing the drive may be difficult. A solid state drive may malfunction owing to corruption of the software and data stored in the memory of the solid state drive. Also, the memory resident in a solid state drive may deteriorate with use, time and temperature. Deterioration of memory causes corruption of data stored in portions of the memory. The lost data may include software and configuration information that the processor of the solid state drive uses to operate the solid state drive.

SUMMARY

Methods, apparatuses and systems are disclosed herein for recovering from failures of a flash memory device, such as an embedded flash memory device.

According to one aspect, a method for initializing a memory system is disclosed. The memory system comprises a non-volatile memory (NVM) and a read only memory (ROM). The NVM comprises a plurality of memory pages. On detecting a power-on reset (POR) command at the memory system, a determination is made whether the memory system has previously received the POR command from a host. When it is determined that the memory system has not previously received the POR command from the host, pre-programmed configuration data is read from the ROM and the memory system is initialized using the pre-programmed configuration data. An error correction code (ECC) is generated for the pre-programmed configuration data and the pre-programmed configuration data including the ECC is store in one of the plurality of pages of the NVM memory.

According to another aspect, a method for initializing a memory is disclosed. In a memory system comprising a read only memory (ROM) and a non-volatile memory (NVM) having a plurality of memory pages, the method comprises reading configuration data status information stored in the memory system. Determining from the configuration data status information whether pre-programmed configuration data is in the ROM or NVM. Reading the pre-programmed configuration data from the NVM when the pre-programmed configuration data is determined to be in the NVM. Determining whether there are errors in the read pre-programmed configuration data based on an ECC stored with the read the pre-programmed configuration data, and configuring the memory system using the pre-programmed configuration data, when it is determined that there are no errors in the data.

According to yet another aspect, a device comprising a storage device is disclosed. The storage device comprises a non-volatile memory (NVM) comprising a plurality of memory pages, a read only memory (ROM), a register configured to store a flag indicating a location of pre-programmed configuration data, and a configuration module wherein the configuration module is configured to read the flag stored in the register and to read pre-programmed configuration data from either the ROM or the NVM based on a setting of the flag.

Other features and advantages will become apparent upon review of the following drawings, detailed description and claims. Additionally, other embodiments are disclosed, and each of the embodiments can be used alone or together in combination. The embodiments will now be described with reference to the attached drawings.

DETAILED DESCRIPTION

Typically, componentry in a solid state storage (SSD) device reads pre-programmed configuration data stored in non-volatile memory (NVM) of the SSD after a power on reset (POR). As will be explained in detail later, the pre-programmed configuration data are used to configure internal circuitry of the SSD. With time, data corresponding to the configuration parameters may get corrupted. Methods and apparatuses described herein provide a mechanism to verify the integrity of the data corresponding to the configuration parameters. Additionally, methods described herein provide a mechanism to recover corrupt data corresponding to the configuration parameters. In one embodiment, methods described herein may effectuate verification of data integrity and recovery of corrupt data by using an error correction code (ECC) engine resident in the SSD.

Figure 1:
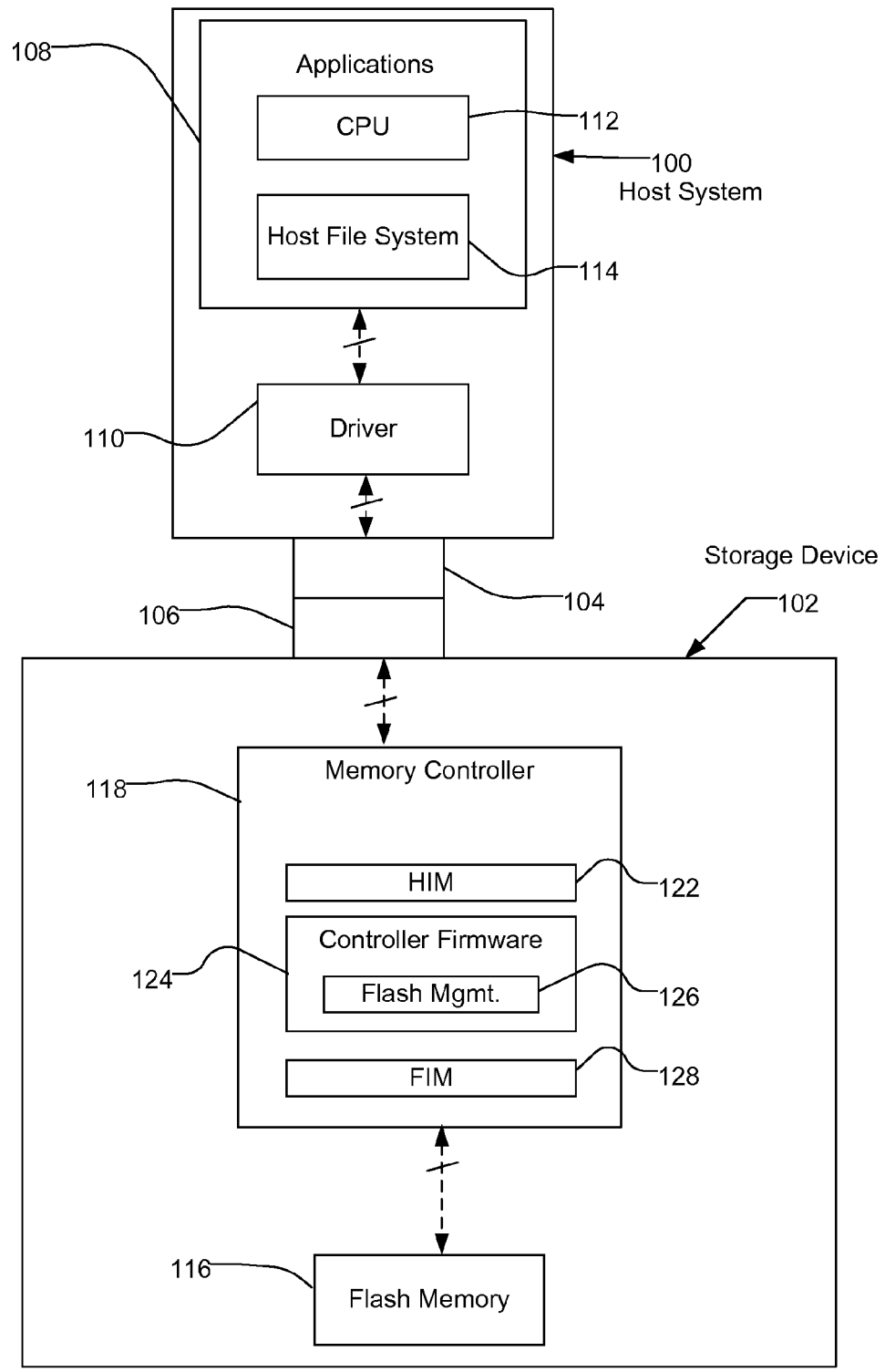
FIG. 1 is a block diagram of an example system that may implement methods to allow verification of the data integrity and recovery of corrupt data of configuration parameters for a storage device.

FIG. 1 is block diagram of an exemplary flash memory system that may implement methods to allow verification of the data integrity and recovery of corrupt data of configuration parameters in FIG. 1. A host system 100 of FIG. 1 stores data into and retrieves data from a flash memory 102. The flash memory may be embedded within the host, such as in the form of a solid state disk (SSD) drive installed in a personal computer. Alternatively, the memory 102 may be in the form of a flash memory card that is removably connected to the host through mating parts 104 and 106 of a mechanical and electrical connector as illustrated in FIG. 1. A flash memory configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives. As described, flash memory may refer to the use of a negated AND (NAND) cell that stores an electronic charge.

Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The host system 100 of FIG. 1 may be viewed as having two major parts, insofar as the memory device 102 is concerned, made up of a combination of circuitry and software. An applications portion 108 may interface with the memory device 102 through a file system module 114 and driver 110. In a PC, for example, the applications portion 108 may include a processor 112 for running word processing, graphics, control or other popular application software. In a camera, cellular telephone that is primarily dedicated to performing a single set of functions, the applications portion 108 may be implemented in hardware for running the software that operates the camera to take and store pictures, the cellular telephone to make and receive calls, and the like.

The storage device 102 of FIG. 1 may include non-volatile memory, such as memory 116, and a memory controller 118 that both interfaces with the host 100 to which the storage device 102 is connected for passing data back and forth and controls the memory 116. The memory controller 118 may be implemented on a single integrated circuit chip, such as an application specific integrated circuit (ASIC). The memory controller 118 may include a multi-thread processor capable of communicating via a memory interface 128 having I/O ports for each memory bank in the memory 116. The memory controller 118 may include an internal clock. The processor of the memory controller 118 may communicate with an error correction code (ECC) module, a RAM buffer, and a boot code ROM via an internal data bus.

The memory controller 118 may convert between logical addresses of data used by the host 100 and physical addresses of the memory 116 during data programming and reading. Functionally, the memory controller 118 may include a Host interface module (HIM) 122 that interfaces with the host system controller logic 110, and controller firmware module 124 for coordinating with the host interface module 122, and flash interface module (FIM) 128. Flash management logic 126 may be part of the controller firmware 124 for internal memory management operations such as garbage collection. One or more flash interface modules (FIMs) 128 may provide a communication interface between the controller and the memory 116. The memory device firmware may handle memory in logical groups and the logical to physical address table (i.e. the global address table or "GAT") may have an entry for each logical group. In particular, the GAT page may include mapping of the logical to the physical address translation for each logical group.

A flash transformation layer ("FTL") or media management layer ("MML") may be integrated in the flash management 126 and may handle flash errors and interfacing with the host. In particular, flash management 126 is part of controller firmware 124 and FTL may be a module in flash management. The FTL may be responsible for the internals of NAND management. In particular, the FTL may be an algorithm in the memory device firmware which translates writes from the host 100 into writes to the memory 116. The FTL may include the logical block address ("LBA") map that translates addresses for the flash memory. An FTL algorithm may provide logical to physical address mapping which includes an algorithm to convert logical addresses from the file system to physical addresses of flash memory. The FTL may include the establishment or classification of meta-blocks and the dual programming of those meta-blocks as discussed below with respect to FIGS. 5-12.

In one embodiment, the memory 116 may be considered to include multi-level cell (MLC) or single level cell (SLC) memory. The memory may be included as part of the memory controller 118 rather than as part of the memory 116 in some embodiments. The memory 116 may be mostly MLC, while binary cache and update blocks may be SLC memory. Update blocks may be SLC memory with page based addressing or page based Logical Group (LG) organization. The LG size for the GAT may depend on the data. For example, sequential data may be indexed with a large LG size, while fragmented data may be indexed with a smaller LG size. In particular, the GAT may default to a large LG size, but reference additional GAT pages for fragmented data, where the additional GAT pages include a smaller LG size. The LG size for the GAT and additional GAT pages may occur at the FTL or flash management 126 of the controller 118.

Figure 2A:
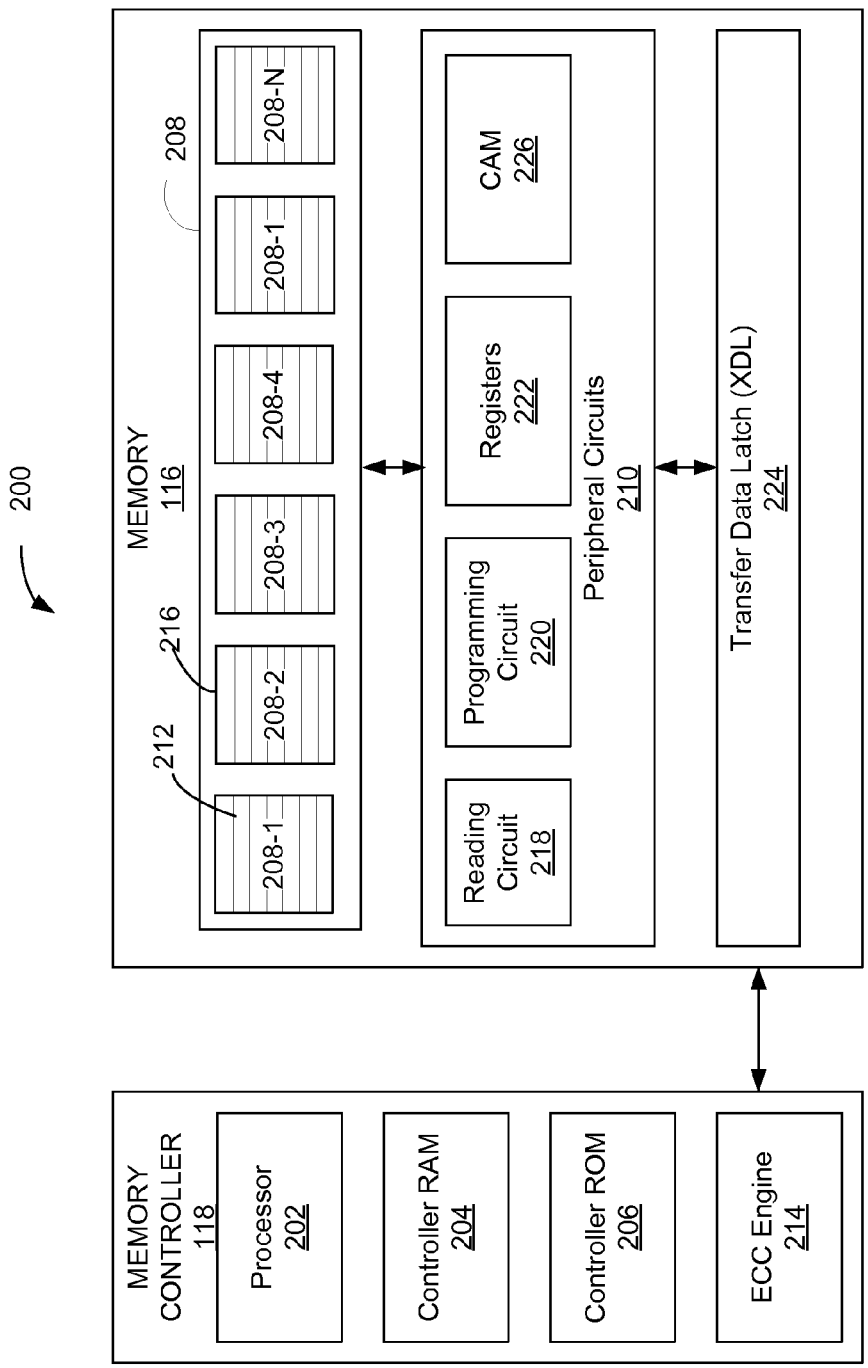
FIG. 2A is an example block diagram of an example storage device that may operate in the system of FIG. 1.

FIG. 2A is a detailed block diagram of an example memory system 200. In an embodiment, the example memory system 200 may correspond to the storage device 102 of FIG. 1. In this embodiment, memory system 200 comprises a memory controller 118 and memory 116.

By way of example and without limitation, in an embodiment, memory controller 118 includes a processor 202, controller RAM 204, controller ROM 206 and error correcting code (ECC) engine 214. The processor 202 may comprise a microprocessor, a microcontroller, an application specific integrated circuit (ASIC), a field programmable gate array, a logical digital circuit, or other now known or later developed logical processing capability.

Controller ROM 206 may store software instructions that processor 202 may execute to control the operation of storage device 102. Controller ROM 206 may also include software instructions that when executed by processor 202 effectuate the verification of data corresponding to configuration parameters and the recovery of corrupt data corresponding to configuration parameters stored in memory 116. Controller ROM 206 may be used to store instructions corresponding to the basic input output system (BIOS). The instructions of the BIOS when executed by processor 202 may cause the initialization and testing of the memory system 200 components and cause the processor 202 to search for and load a boot code or an operating system stored in memory 116.

Examples of controller ROM 204 include electrically erasable programmable read only memory (EEPROM), NOR flash memory etc. A characteristic of controller ROM 204 is that it can be read and written on a byte by byte or word by word basis.

Generally, boot code is program code that, when executed, loads the main operating system or runtime environment from the memory 116 to RAM 204 and initiates the execution of the main operating system. Boot code may also include instructions that when executed by processor 202 cause initialization of hardware components of the memory system 200. On successful loading of the operating system, the memory system 200 is available to receive commands from the host system 100 to read and write information to memory 116.

In normal operation, when host system 100 is powered on it may command the memory system 200 to reset or start operation. In response to receiving a command to reset, processor 202 may start executing instructions corresponding to the BIOS stored in controller ROM 206. After initialization of the memory system 200, the processor 202 may execute boot code stored in a predetermined memory blocks of memory 116. Alternatively, the processor 202 may execute instructions of the BIOS to search for boot code and configuration parameters. By way of example and without limitation, boot code and configuration parameters constitute a non-exclusive list of initialization information. Generally, initialization information consists of any information that may be used to configure software and hardware components of the memory system 200.

ECC engine 214 is configured to compute an ECC for a set of binary data. The computed ECC may be appended to the data before it is stored in memory 116. The ECC engine 214 may utilize the stored ECC to identify and correct errors in the data at a later point in time.

In an exemplary embodiment, memory 116 includes non-volatile memory 208, peripheral circuits 210 and a transfer data latch (XDL) 224. In a preferred embodiment, non-volatile memory 208 comprises NAND flash memory. In this embodiment, non-volatile memory 208 is organized as N memory blocks 208-1 to 208-N. A memory block is organized as a set of memory pages or simply pages, memory page 212 for example. In this embodiment, a memory page is a smallest unit of writing in the memory 108 and a memory block is the smallest unit of erasing. Thus, In contrast to controller ROM 204 which may be read and written to on a byte by byte basis, data is typically programmed or stored in NAND flash memory on a page by page basis. However, erasing data programmed in a page requires erasure of all the pages in the memory block.

Each memory page consists of a set of single-level memory cells (SLC) or multi-level memory cells (MLC). A memory cell discussed with reference to FIG. 2 may correspond to a storage unit discussed with reference to FIG. 1. A SLC memory can store a single bit of data per cell. MLC memory can store multiple bits of data per cell. For example, two-level MLC memory can store 2 bits of data per cell, three level MLC memory can store 3 bits of data per cell and N level MLC memory can store N bits of data per cell. Typical sizes of memory pages are 512 bytes, 4 Kilobytes and 16 Kilobytes (Kbytes). A memory block typically consists of hundreds of memory pages. In describing exemplary embodiments herein, the term "cell" is used to refer to both SLC and MLC. A memory cell can be in an erased state or a programmed state. A memory page with memory cells in an erased state may be referred to as an erased memory page. Data received from the host system 100 is typically programmed or stored in an erased memory page.

Both types of cells (SLC and MLC) store data by storing electric charge (charge). The amount of electric charge stored in a cell is representative of the data bit(s) stored in the cell. For example, in case of an erased SLC, no charge or an infinitesimal amount of electric charge is stored in the SLC and this uncharged state represents a bit value of 0. In contrast, a predefined amount of electric charge stored in an SLC, represents the bit value of 1. In the case of an N-level MLC, $2^N$ different predefined amounts of charge may be stored to represent one of N values. For example, a three-level MLC is configured to store any one of eight amounts of electric charge values ($2^3=8$) and correspondingly any one of eight possible binary values, 000 to 111. The number of different bits of data that may be stored in a memory cell may be referred to as the density of the memory cell. Thus a 3-level, or 3 bits per cell MLC is denser than a 2-level, or 2 bits per cell MLC and so on.

Peripheral circuits 210 may include electronic componentry such as analog to digital convertors (ADC), digital to analog convertors (DAC), charge pumps, amplifiers, level shifters etc. By way of example and without limitation, in an embodiment, the electronic componentry may be functionally and logically categorized as programming circuit 220, reading circuit 218, registers 222 and content addressable memory (CAM) 226.

In an embodiment, the reading circuit 218 of FIG. 2 translates the amount of charge stored in a memory cell to a binary representation of the data corresponding to the amount of charge stored in the cell. By way of example and without limitation, the reading circuit 218 may include current to voltage convertors, amplifiers and analog to digital convertors.

The programming circuit of FIG. 2 translates the binary representation of data received from host system 100 into programming voltages and periods. The programming circuit applies these programming voltages for the periods programming periods to memory cells to cause the memory cells to store electric charge. The amount of stored electric charge is representative of the binary representation of the received data.

Memory controller 118 and peripheral circuits 210 may utilize configuration information stored in memory 116 to operate the reading and peripheral circuits. In this example, configuration information may include voltage levels used to program the DACs to cause writing or erasing cells, etc. Additional configuration parameters may include trimming parameters such as reference voltage trimming, charge pump trimming, temperature trimming, bad block information and bad wordline information.

The XDL 224 functions as intermediate data storage between memory controller 106 and memory 108. When instructed by host 100 to write data to memory 108, memory controller 106 writes data to XDL 224. The programming circuit 220 then writes the data from XDL 224 to the specified memory block and page. By way of example and without limitation, the size of the XDL is equal to the size of a page. Similarly, when instructed to read data from a specified memory page, reading circuit 218 reads data from the specified memory page into the XDL 224 and memory controller 106 transfers the read data from the XDL 224 to controller RAM 204.

In an embodiment, the memory controller 118 maintains a logical to physical address table in controller RAM 204. An entry in the table may include a reference to a memory page. One format of an entry in the table may comprise a reference to the memory block associated with the memory page and an index or offset into the memory block. Memory controller 118 may periodically store the logical to physical address table in one or more memory pages of memory 116. The stored logical to physical address table may be retrieved by memory controller 118 on a power on reset (POR) to reconstruct the manner in which data is organized and stored in the memory pages of memory 116. A power-on reset (POR) is a reset signal generated when power is applied to the device, storage device 102 for example. The reset signal ensures that the device starts operating in a known state. In some embodiments, host system 100 may issue a command to storage device 102 to cause the storage device 102 to reset. The configuration parameters may also constitute the stored logical to physical address table.

The host system 100 when requesting a write of data specifies a logical address. In response to receiving a request from host system 100 to write data to a logical address, processor 202 may utilize the logical address as an index into the logical to physical address table and identify the memory page and the memory block corresponding to the logical address. The processor 202 may determine if the identified memory page is already written to (not erase). In response to determining that the memory page is not erased, processor 202 may locate a new memory page that has not been written to and write the received data to the new memory page. Separately, processor 202 may update the entry in the logical to physical address table corresponding to the logical address with a reference to the memory block associated with the new memory page.

Typically when memory controller 118 is instructed by host system 100 to write data to memory 116, processor 202 may cause the ECC engine 214 to calculate an error correcting code (ECC) for the data. An example ECC is the low-density parity-check code (LDPC). The calculated ECC may be written to the memory page along with the data. Separately, ECC engine 214 may compute the ECC for data in a memory page whenever the data in the memory page is read out by memory controller 118. The memory controller 118 may read out the data from the memory page in response to receiving a request from host system 100. The ECC engine 214 may compare the computed ECC with the ECC that was stored in the memory page when the data was written to the page. Generally, if the number of bits in error or the bit error rate (BER) of the data of a memory page is below a threshold, the ECC engine 214 may utilize the ECC stored with the data to recover the bits in error and write the corrected data back to a new memory page.

In an embodiment, when powered on for the first time memory controller 118 may read data corresponding to pre-programmed configuration data stored in controller ROM 206, for example and instruct ECC engine 214 to compute an ECC for the read data. Memory controller 118 may store the computed ECC with the pre-programmed configuration data in a memory page, memory page 212 for example. Separately, memory controller 118 may program a flag in CAM 226 indicating that the pre-programmed configuration data have been stored with an ECC. The CAM 226 may also include the address of the memory page where the configuration parameters and the ECC are stored. On subsequent POR, memory controller may check the flag. If the flag is set, memory controller 118 may retrieve the configuration parameters and the associated ECC for the configuration parameters from the memory page. Memory controller 118 may instruct ECC engine 214 to verify the integrity of the data corresponding to the configuration parameters. As previously discussed, ECC engine 214 may utilize the ECC stored with the data to verify the integrity of the data. In response to detecting one or more data bits in error, ECC engine 214 may utilize the ECC to recover the bits in error and correct the data. Memory controller 118 may store the corrected data back into the appropriate memory page. The corrected data corresponding to the configuration parameters may be then used to configure the peripheral circuitry for example, to enable normal operation of the memory system 200.

Figure 2B:
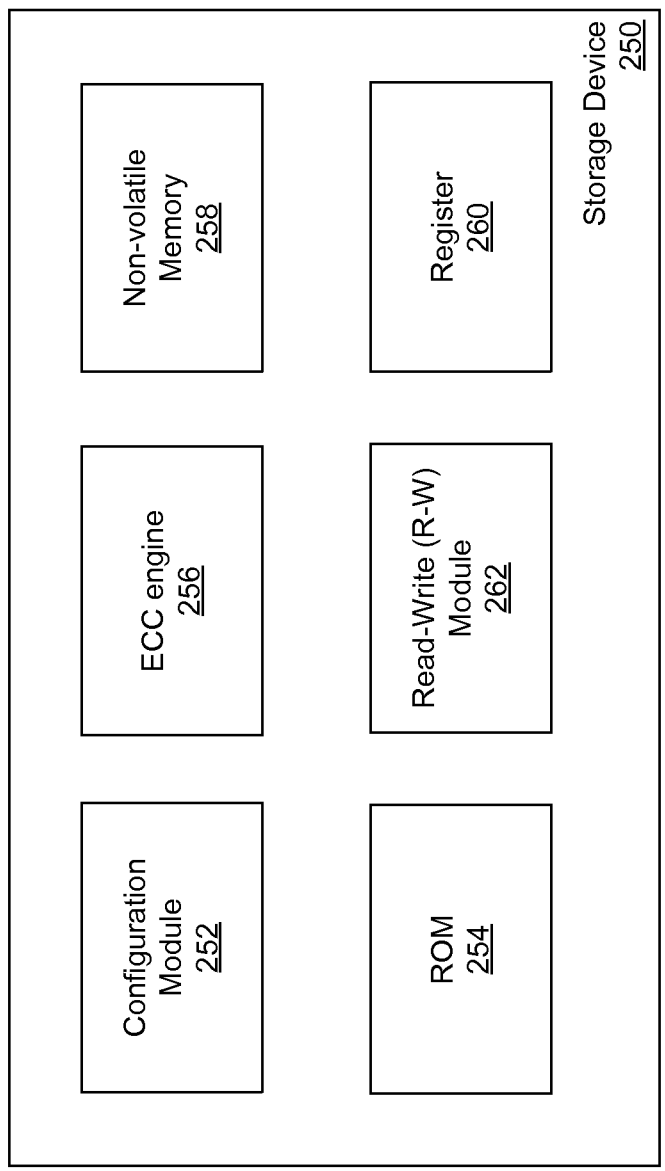
FIG. 2B is an example block diagram of another example storage device that may operate in the system of FIG. 1.

FIG. 2B is a block diagram of an exemplary storage device 250 that may implement methods for validating configuration parameters and correct errors in the configuration parameters. Storage device 250 is functionally adapted to store data received from a host system 100.

As previously discussed, the pre-programmed configuration data may be programmed into ROM 254 during manufacture and may include calibration and test data that may be used to configure non-volatile memory 258. ROM 254 may be programmed using an appropriate in-circuit programming method during the manufacturing of storage device 250.

In one embodiment, NVM 258 may correspond to NAND flash memory. In this embodiment, read-write (R-W) module 262 may be configured to read and write data to the NAND flash memory. R-W module 262 may correspond to reading circuit 218 and programming circuit 220 of FIG. 2B.

On detection of a POR, configuration module 252 may be configured to retrieve the contents of register 260. Register 260 may store information for a power-on bypass flag. The register 260 may be set to a default cleared state during the manufacture of storage device 250. Configuration module 252 may be configured to compare the setting of the bypass flag with a value for the default cleared state. As previously explained, the default cleared state of the bypass flag indicates that the storage device 252 has not previously been powered-on in an operational mode. In response to determining that the bypass flag is set to the default cleared state, configuration module 252 may read the pre-programmed configuration data from a predefined location in ROM 254.

ECC engine 256 is configured to compute an ECC for data received from the configuration module 252. Separately, ECC engine 256 is also configured to correct errors in data from a previously computed ECC for the data.

Configuration module 252 after reading configuration parameters from ROM 254 may instruct ECC engine 256 to compute an ECC for configuration parameters read from ROM 254. Configuration module 252 may store the data corresponding to the configuration parameters and the computed ECC in NVM 258. Configuration module 252 may also use the read configuration parameters to configure the NVM 258 and storage device 250 to permit functional operation of the storage device 250. Separately and significantly, configuration module 252 may alter the contents of register 260 to set the bypass flag to indicate that the configuration parameters and a corresponding ECC are stored in NVM 258.

In a preferred embodiment, configuration module 252 may store the data read from ROM 254 in a memory page of a memory block of the NAND flash memory of FIG. 2A. For example, memory page 212 of memory block 208-1. Separately, configuration module 252 may store the computed ECC with the data in the memory page. A reference to the identity of the memory page may be stored in a predefined location of ROM 254. Configuration module 252 may instruct the R-W module 262 to store the data in an erased memory page.

When subsequently storage device 250 is powered down and powered up or reset, by host system 100 for example, as previously discussed configuration module 252 may read the value for the bypass flag stored in register 260. Because, the bypass flag was previously set (i.e., not is in the default cleared state), configuration module 252 may read the data corresponding to the configuration parameters from NVM 258. Configuration module 252 may also read the previously computed and stored ECC for the data from the NVM 258.

Configuration module 252 may instruct ECC engine 256 to verify the integrity of the data corresponding to the configuration parameters. In instances, where the ECC engine identifies bits that are in error in the data, ECC engine may utilize the previously computed ECC to correct the erroneous bits. Configuration module 252 may utilize the corrected data to configure the storage device 250 and particularly, NVM 258. Additionally, configuration module 252 may store the corrected data corresponding to the configuration parameters in NVM 258.

In an embodiment where NVM 258 is NAND flash memory, configuration module 252 may instruct R-W module 262 to read the data corresponding to the configuration parameters and the previously computed ECC from the memory page 212, for example. Configuration module 252 may retrieve the previously stored identity of the memory page from the predefined location of ROM 254 and provide the identity of the memory page to R-W module 262 when instructing R-W module 262 to read the data corresponding to the configuration parameters.

The storage device 250 may be implemented in many different ways. Each circuit, such as the configuration module 252, R-W module 262 and ECC engine 256, may be hardware or a combination of hardware and software. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the controller ROM 206 (FIG. 2A), for example, that comprises instructions executable with the processor 202 or other processor to implement one or more of the features of the circuit. When any one of the modules includes the portion of the memory that comprises instructions executable with the processor, the module may or may not include the processor 202. In some examples, each module may just be the portion of the controller ROM 206 or other physical memory that comprises instructions executable with the processor 202 or other processor to implement the features of the corresponding module without the module including any other hardware. Because each module includes at least some hardware even when the included hardware comprises software, each module may be interchangeably referred to as hardware module.

Figure 3:
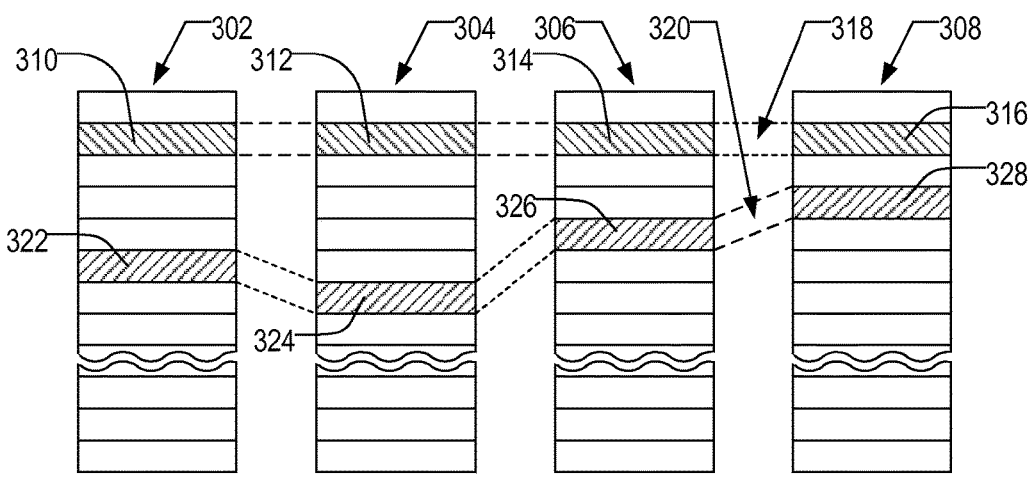
FIG. 3 is an example physical memory organization of the system of FIG. 1.

FIG. 3 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 302, 304, 306, and 308 of memory cells may be on a single integrated memory cell chip, on two chips (two of the planes on each chip) or on four separate chips. Although not shown in FIG. 3, the meta-blocks described below may be linked from across different dies. For example, there may be two planes per die and the meta-block linking shown in FIG. 6 links planes from different dies. In the context of a non-volatile memory, "die" refers to the collection of non-volatile memory cells, and associated circuitry for managing the physical operation of those memory cells, that are formed on a single semiconductor substrate. Typically, integrated circuits are produced in large batches on a single wafer of electronic-grade silicon (EGS) or other semiconductor through suitable well-known processes such as photolithography. The wafer is cut or "diced" into many pieces. Each of these pieces is called a die.

Other numbers of planes, such as 1, 2, 8, 16 or more may exist in a system. The planes may be individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane. The block of memory cells is the unit of erase, and the smallest number of memory cells that are physically erasable together. For increased parallelism, however, the blocks may be operated in larger metablock units. One block from each plane is logically linked together to form a metablock. The four blocks 310, 312, 314, and 316 are shown to form one metablock 318. All of the cells within a metablock are typically erased together. The blocks used to form a meta-block need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation. As described below with respect to FIG. 6, the meta-block may be created with planes from different dies. In other words, each meta-block includes planes from different dies.

Figure 4:
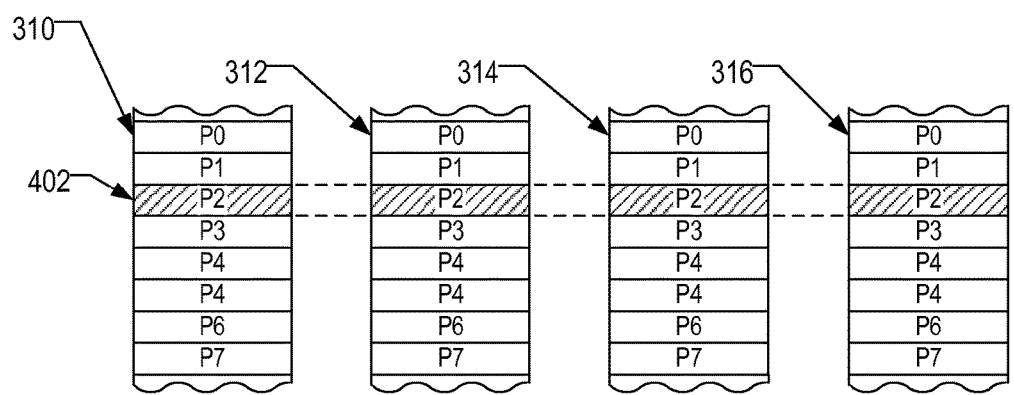
FIG. 4 is an expanded view of a portion of the physical memory of FIG. 3.

The individual blocks may be divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 3, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

Figure 5:
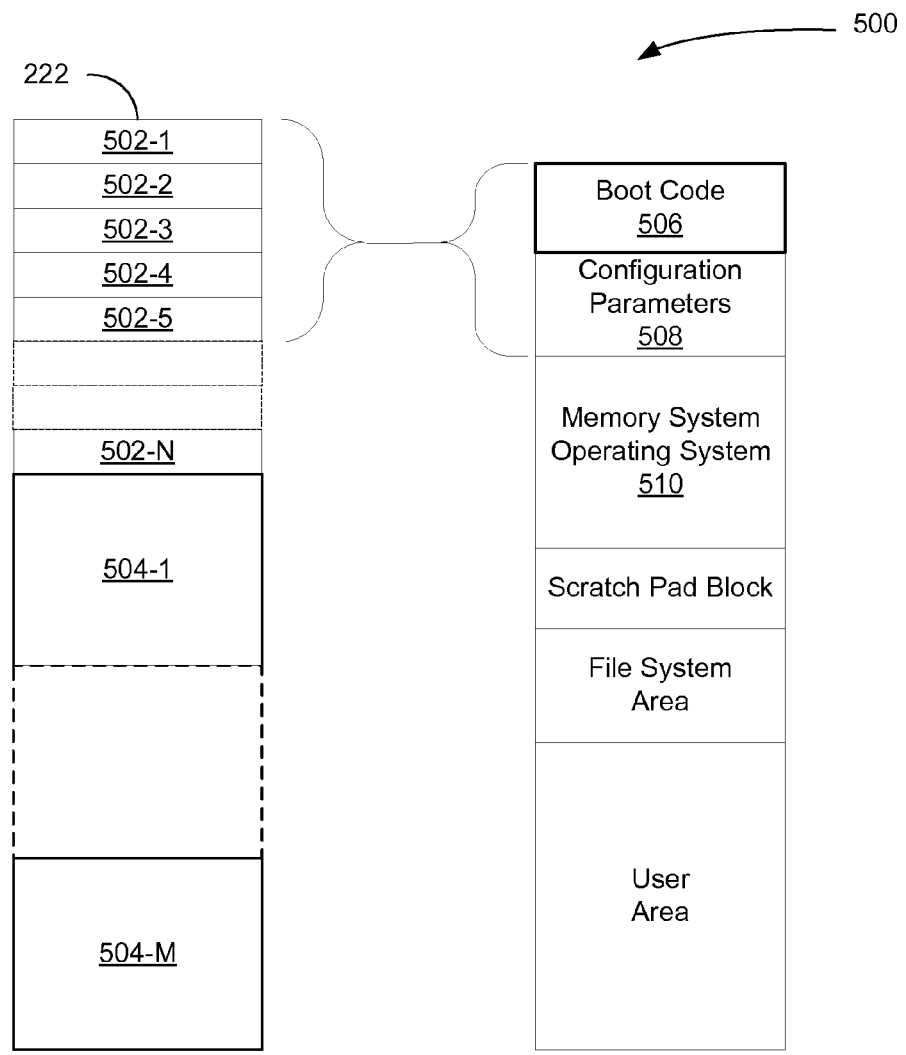
FIG. 5 is an example memory map for memory of the example device of FIG. 2.

FIG. 5 is an example memory layout 500 of the several previously discussed software elements including boot code 506, memory system operating system 510, etc. The above listed software elements are stored memory 116. By way of example and without limitation, boot code 506 occupies memory blocks 502-2 and 502-3. In this example, memory 116 consists of memory blocks 502-1, 502-2 . . . 502-N, 504-1 . . . 504-M. By way of example and without limitation, memory 116 consists of N memory blocks having a first size or storage capacity and M memory blocks having a second size or second storage capacity. The N memory blocks may correspond to boot blocks where boot code 506 and configuration parameters 508 are stored. In an embodiment, the N memory blocks may comprise SLC type memory cells and the M memory blocks may comprise MLC type memory cells. Configuration parameters stored in controller ROM 206 may include information about the geometry of the memory 116, the arrangement and ordering of the memory blocks, the density of the memory blocks i.e. number of levels in an MLC, the voltage levels to be applied to a cell to erase or write a bit to the cell, etc. Memory blocks 504-1 . . . 504-M may be used by host system 202 to store the host operating system, IOS for example, and user applications.

Figure 6:
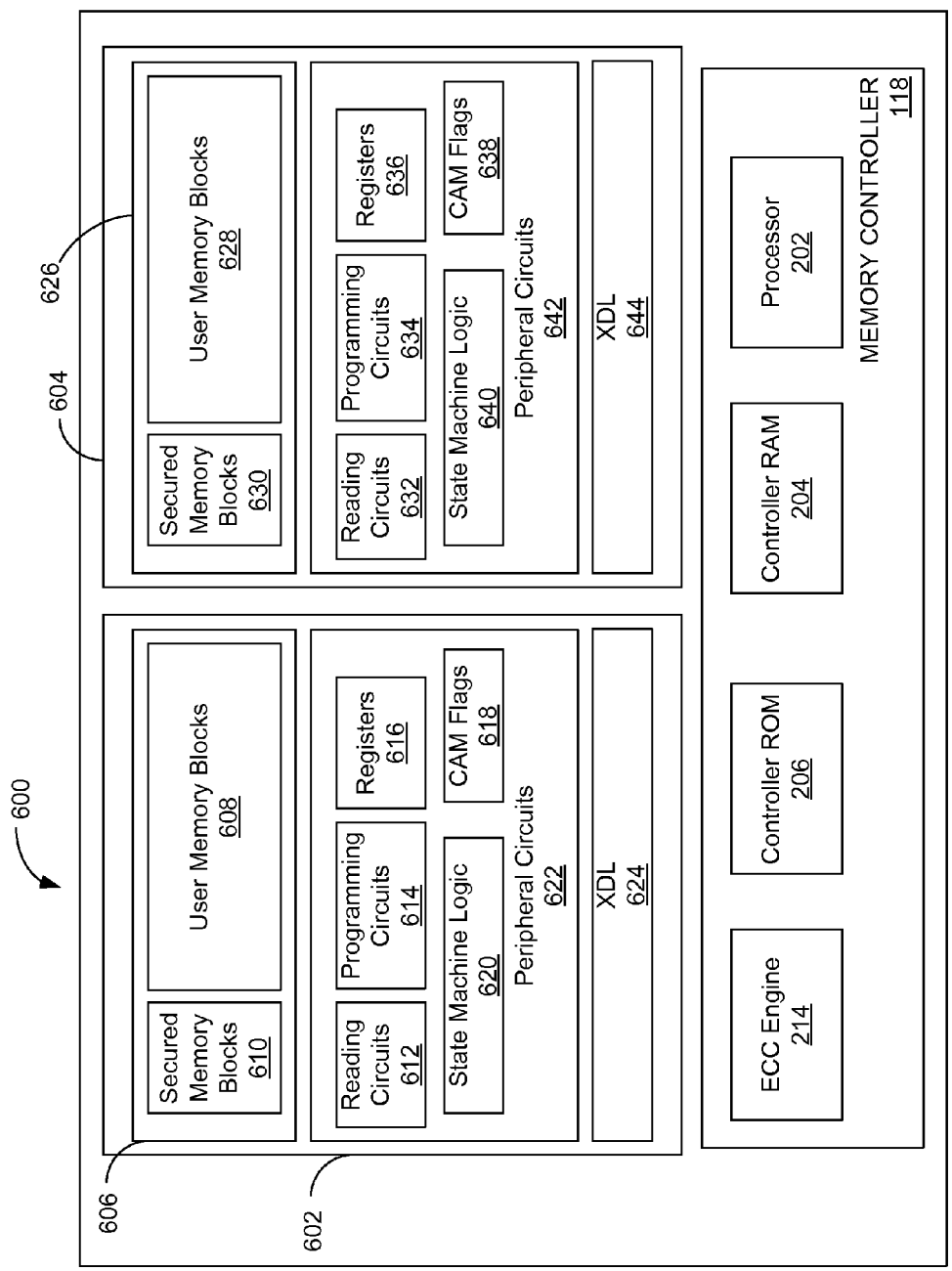
FIG. 6 is block diagram of an example multi-die storage system that may operate in the system of FIG. 1.

FIG. 6 is a block diagram of an exemplary multi-die memory system 600. In an embodiment, the example memory system 600 may correspond to the storage device 102 of FIG. 1. Memory system 600 comprises memory controller 118 and two memory integrated circuits (ICs), 602 and 604. Memory ICs 602 and 604 may be fabricated on separate dies.

Memory ICs 602 and 604 include memory arrays 606 and 626. Memory arrays 606 and 626 comprises user memory blocks 608, 628 and secured memory blocks 610, 630, respectively. In an exemplary embodiment, secured memory blocks 610, 630 may be used to store pre-programmed configuration parameters. Data stored in secured memory blocks may be encrypted. Memory controller 118 may store data received from host system 100 in user memory blocks 608 or 628. User memory blocks 608, 628 may include SLC-type memory blocks and MLC-type memory blocks, in an embodiment.

Memory ICs 602 and 604 also include peripheral circuits 622, 640. Peripheral circuits 622, 642 include reading circuit 612, 632, programming circuits 614, 634, register 616, 636, content addressable memory (CAM) flags 618, 638 and state machine logic 620, 640. As previously discussed, when instructed, reading circuits 612 read charge stored in memory cells of pages of memory blocks 608 and 610 and convert the read charge into binary data. Programming circuits 614 may be used to store charge corresponding to data received from host system 100 in the memory cells of pages of memory blocks 608 and 610. A CAM flag 618 or 638 may be used to store status information for the memory IC 602. As previously discussed, memory controller 118 may program a flag in CAM 226 indicating that the pre-programmed configuration parameters have been stored with an ECC. State machine logic 620 controls the operation of reading and programming circuits 612 and 614.

A latch, also referred to as transfer data latch (XDL) 624, 644 functions as intermediate data storage between memory controller 106 and memory 108. When instructed by host system 100 to write data to memory 108, memory controller 106 writes data to XDL 624 or 644. The programming circuit 220 then writes the data from XDL 624 or 644 to the specified memory block and page. By way of example and without limitation, the size of the XDL is equal to the size of a page. Similarly, when instructed to read data from a specified memory page, reading circuit 218 reads data from the specified memory page into the XDL 624 or 644 and memory controller 118 transfers the read data from the XDL 624 to controller RAM 204.

In an exemplary embodiment, memory controller 118 may use factory-programmed configuration parameters to initialize memory ICs 602 and 604. Each of the memory ICs 602 and 604 may require a separate set of pre-programmed configuration parameters for their respective initialization. In an exemplary embodiment, memory controller 118 may store a copy of pre-programmed configuration parameters for each of the memory ICs 602 and 604 in respective memory pages of the secured memory blocks 610 and 630.

In another embodiment, memory controller 118 may store copies of pre-programmed configuration parameters for both of the memory ICs 602 and 604 in memory pages of the secured memory blocks 610 and 630. Storing copies of pre-programmed configuration parameters for both memory ICs 602 and 604 in memory pages of both memory ICs 602 and 604 provides redundancy. As is explained in detail later, if the pre-programmed configuration parameters stored in one memory IC is corrupt, memory controller 118 may retrieve the copy stored in the other memory IC and use the copy to configure and operate both memory ICs 602 and 604. In this embodiment, after receiving a power on signal, memory controller 118 may check the status of POR bypass flags in CAM flags 618, for example. The setting of the POR bypass flags indicates if the memory controller 118 should read the pre-programmed configuration parameters from ROM 206 or from memory IC 602 or 604. In response to determining that the POR bypass flag is not set, memory controller 118 may read pre-programmed configuration parameters from controller ROM 206 for memory IC 602 and 604, for example. Memory controller 118 may instruct the ECC engine 214 to compute an ECC for the read pre-programmed configuration parameters. The pre-programmed configuration parameters and the computed ECC may be stored in secured memory blocks of both memory ICs. The POR bypass flags in CAM flags 618 may be set. If configuration parameters for both memory ICs are stored in memory blocks of both memory ICs, memory controller 118 may use configuration parameters for one memory IC stored in the other memory IC to configure the memory IC if the configuration parameters for the memory IC stored in the memory blocks of the memory IC are corrupt or invalid.

On a subsequent power on reset, memory controller 118 may check the POR bypass flag and in response to determining that the POR bypass flag is set, memory controller 118 may instruct the reading circuits 612 of memory IC 602 to read previously stored configuration parameters from secured memory blocks of memory IC 602. Memory controller 118 may instruct the ECC engine to verify the integrity of the read configuration parameters using the ECC previously stored with the configuration parameters. If the number of bits in error in the read configuration parameters is less than the error correcting capability threshold of the ECC engine 214, the ECC engine 214 may correct the bit in error. The corrected configuration parameters may be used to initialize the memory ICs 602 and 604.

In the scenario where the number of bits in error exceeds the error correcting capability threshold of the ECC engine 214, memory controller 118 may instruct the reading circuits 632 of memory IC 604 to read previously stored configuration parameters from secured memory blocks of memory IC 604. Memory controller 118 may instruct the ECC engine to verify the integrity of the read configuration parameters using the ECC previously stored with the configuration parameters. If the configuration parameters have several bits in error and if the number of bits in error in the read configuration parameters is less than the error correcting capability threshold of the ECC engine 214, the ECC engine 214 may correct the bit in error. The corrected configuration parameters may be used to initialize the memory ICs 602 and 604. In an embodiment, the secured memory blocks of memory IC 602 may be updated with the configuration parameters read from the secured memory blocks of memory IC 604 if the read configuration parameters are without errors after ECC correction or verification by ECC engine 214.

In the foregoing discussing, memory controller 118 is described as using a multi-die memory to store pre-programmed configuration parameters for redundancy. In another embodiment, non-volatile memory 258 of storage device 250 of FIG. 2B may be replaced with a multi-die memory for example memory ICs 602 and 604 to provide the benefits of redundancy described above.

Figure 7:
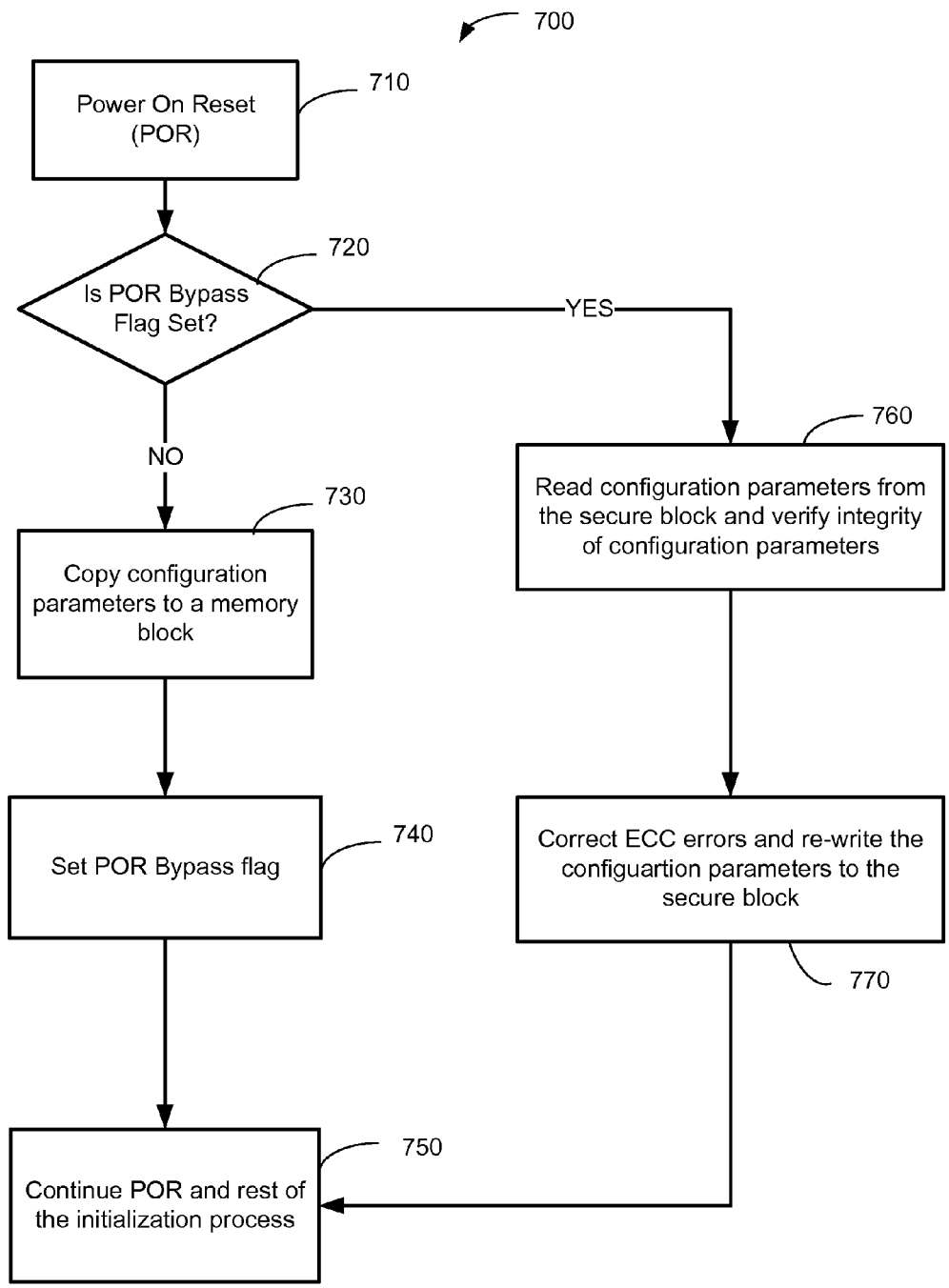
FIG. 7 is a flow diagram of an example method that may be implemented by a memory system.

FIG. 7 is a flow diagram of an exemplary method 700 that may be implemented to verify, authenticate and correct data corresponding to previously described configuration parameters. Method 700 may be implemented by memory system 200. Functionality ascribed to the various steps of method 700 may be implemented by software instructions or hardware componentry or any combination thereof. In an exemplary embodiment, method 700 may be implemented as software instructions and stored in controller ROM 206. The software instructions may be executed by processor 202 to effectuate the method steps of verifying the data corresponding to the configuration parameters and correcting any errors detected in the data.

At step 710, memory system 200 may receive a power on reset signal from host system 100. The power on reset signal may correspond to the application of a voltage supply to memory system 200. In response to receiving the power on reset, circuitry in the memory system 200 may cause the initialization of processor 202. In an embodiment, at step 710, processor 200 may retrieve and execute software instructions corresponding to the BIOS from controller ROM 206. Execution of the instructions may cause the initialization of controller RAM 204 and ECC engine 214. Separately, at step 710, select circuitry of memory 116 may be initialized.

At step 720, processor 202 may determine if configuration parameters were previously copied from controller ROM 206 to memory 116. The determination may be made by examining a POR Bypass flag or simply flag stored in CAM 226, in an embodiment. The flag may correspond to a single data bit or data having more than one bit of information, a byte or a word, for example. The flag may be cleared or initialized to a default value, 0 or 0xFF for example, during the factory manufacturing process. At step 720 in response to determining that the flag is cleared or initialized to its default value, processor 202 may conclude that this is the first time that memory system 200 is being turned on. In response to making this determination, program flow may branch to step 730.

At step 730, processor 202 may execute instructions stored in controller ROM 206 to search controller ROM for data corresponding to pre-programmed configuration data. Data corresponding to the configuration parameters may be stored in controller ROM 206 during the testing and calibration of memory system 200. Searching for data corresponding to pre-programmed configuration data may include searching for a signature associated with the configuration parameters at pre-defined memory boundaries of controller ROM 206, for example every 16 Kbyte boundary. In response to locating the configuration parameters, at step 730, a preliminary verification may be performed. Computing a checksum over the configuration parameters and comparing the computed checksum with pre-programmed checksum stored with the configuration parameters is one example of a preliminary verification that may be performed at step 730. The configuration parameters may be copied to controller RAM 204.

After completion of the preliminary verification, processor 202 may instruct the ECC engine 214 to compute an ECC for the configuration parameters stored in RAM. In response to receiving an indication from ECC engine that an ECC is computed, processor 202 may store the configuration parameters and the ECC in a memory page of memory 116, memory page 212 for example.

At step 740, the flag may be updated in CAM 226 to indicate that the configuration parameters and the associated ECC are stored in a memory page. An address of the memory page may be stored in CAM 226 or controller ROM 206, in an embodiment.

At step 750, the remaining initialization of the memory system 200 may be completed. For example, peripheral circuit 210 may be programmed with the appropriate configuration parameters. Separately, at step 750, software instructions may be instructed to search the memory pages of memory 116 to locate and execute boot code 506 and memory system OS 510, for example.

Returning to step 720, in response to determining that the POR bypass flag is set, program flow may branch to step 760. As previously discussed, a set flag indicates that data corresponding to configuration parameters and a corresponding ECC was stored in a memory page during a previous POR. At step 760, in an embodiment, processor 202 may locate a memory page in memory 116 where a copy of the configuration parameters was previously stored. At step 760, the data corresponding to the configuration parameters and the associated ECC may be copied to controller RAM 204.

At step 770, ECC engine 214 may be instructed to validate the copied data. As previously discussed, ECC engine 214 may utilize the previously computed ECC to correct any errors in the data corresponding to the configuration parameters. In response to determining that errors were corrected in the data, processor 202 may store corrected data corresponding to configuration parameters to a new memory page at step 770. Information of the location and identity of the new memory page may be updated in the CAM 226 or controller ROM 206. Program control may then branch to the previously discussed step 750.

Figure 8:
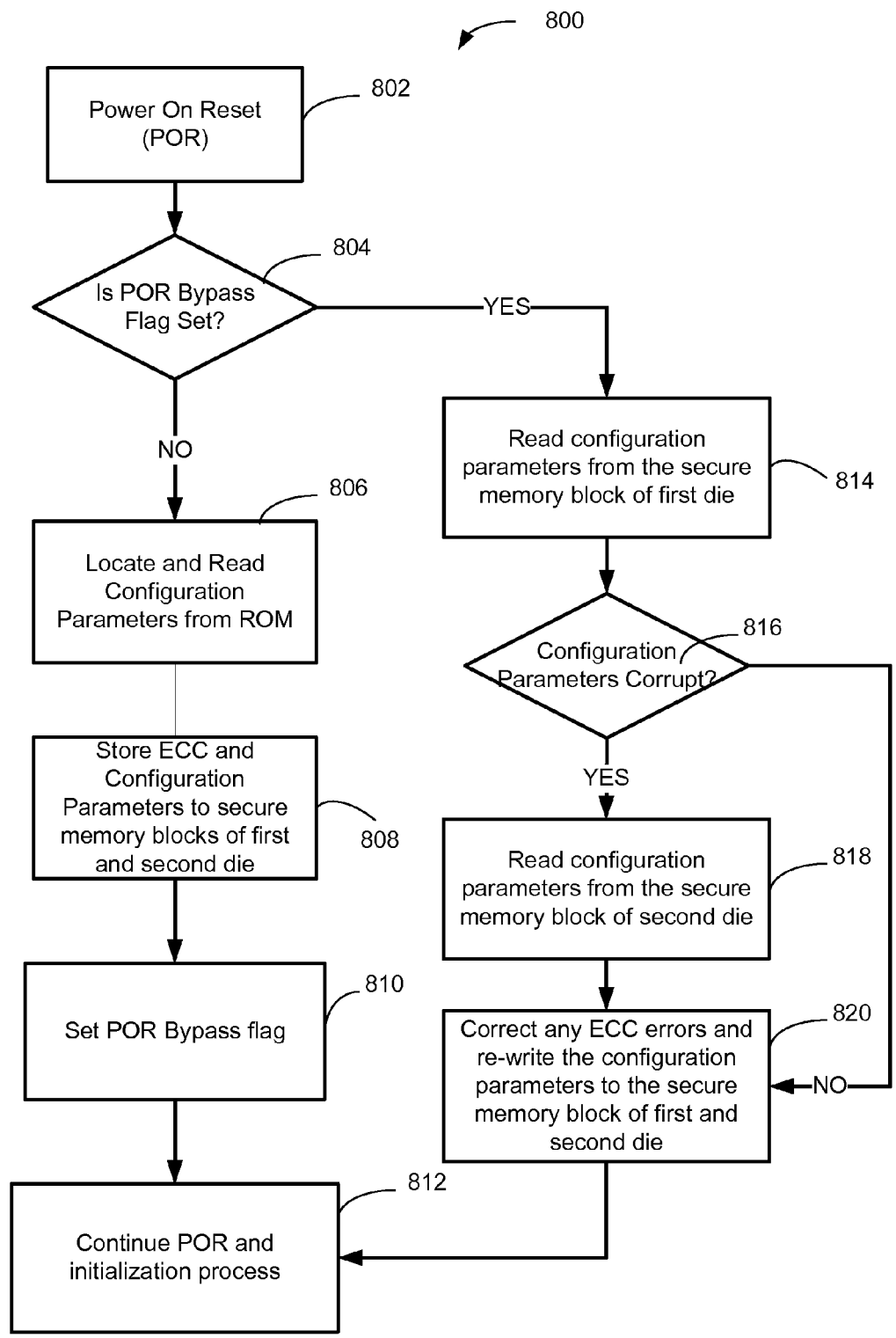
FIG. 8 is a flow diagram of another example method that may be implemented by a memory system.

FIG. 8 is a flow diagram of an exemplary method 800 that may be executed by memory system 600. As previously discussed and by way of example and without limitation, memory system 600 includes two memory dies or ICs 602 and 604 in a single package. Functionality ascribed to the various steps of method 800 may be implemented by software instructions or hardware componentry or any combination thereof. In an exemplary embodiment, method 800 may be implemented as software instructions and stored in controller ROM 206. The software instructions may be executed by processor 202 to effectuate the method steps of verifying the data corresponding to the configuration parameters and correcting any errors detected in the data.

At step 802, memory system 600 may receive a power on reset signal from host system 100. The power on reset signal may correspond to the application of a voltage supply to memory system 200. In response to receiving the power on reset, circuitry in the memory system 200 may cause the initialization of processor 202. In an embodiment, at step 802, processor 200 may retrieve and execute software instructions corresponding to the BIOS from controller ROM 206. Execution of the instructions may cause the initialization of controller RAM 204 and ECC engine 214. Separately, at step 802, select circuitry of memory 116 may be initialized.

At step 804, in an embodiment, processor 202 may determine if configuration parameters were previously copied from controller ROM 206 to memory 116. The determination may be made by examining a POR Bypass flag or simply flag stored in CAM flags 618, in an embodiment. In another embodiment, configuration module 252 (FIG. 2B) may examine a POR Bypass flag stored in register 260. Based on the setting of this flag, configuration module 252 may determine if configuration parameters were previously copied from ROM 254 to non-volatile memory 258. The flag may correspond to a single data bit or data having more than one bit of information, a byte or a word, for example. The flag may be cleared or initialized to a default value, 0 or 0xFF for example, during the factory manufacturing process. At step 804 in response to determining that the flag is cleared or initialized to its default value, processor 202 may conclude that this is the first time that memory system 200 is being turned on. In response to making this determination, program flow may branch to step 806.

At step 806, processor 202 may execute instructions stored in controller ROM 206 to search controller ROM for data corresponding to pre-programmed configuration data. Data corresponding to the configuration parameters may be stored in controller ROM 206 during the testing and calibration of memory system 200. Searching for data corresponding to pre-programmed configuration data may include searching for a signature associated with the configuration parameters at pre-defined memory boundaries of controller ROM 206, for example every 16 Kbyte boundary. In response to locating the configuration parameters, at step 806, a preliminary verification may be performed. Computing a checksum over the configuration parameters and comparing the computed checksum with pre-programmed checksum stored with the configuration parameters is one example of a preliminary verification that may be performed at step 806. The configuration parameters may be copied to controller RAM 204.

At step 808, after completion of the preliminary verification, processor 202 may instruct the ECC engine 214 to compute an ECC for the configuration parameters stored in RAM. In response to receiving an indication from ECC engine that an ECC is computed, processor 202 may store the configuration parameters and the ECC in a secured memory page of secured memory block 610 of memory IC 602 and a secured memory page of secured memory block 630 of memory IC 604.

At step 810, the POR bypass flag may be updated in CAM flags 618 or 638 to indicate that the configuration parameters and the associated ECC are stored in a memory page, in an embodiment. In another embodiment, configuration module 252 may update a setting in register 260 to indicate that the configuration parameters and the associated ECC are stored in non-volatile memory 258. An address of the memory page may be stored in registers 616 or 636 or controller ROM 206, in an embodiment.

At step 812, the remaining initialization of the memory system 200 may be completed. For example, peripheral circuit 210 may be programmed with the appropriate configuration parameters. Separately, at step 812, software instructions may be instructed to search the memory pages of memory 116 to locate and execute boot code 506 and memory system OS 510, for example.

Returning to step 804, in response to determining that the POR bypass flag is set, program flow may branch to step 814. As previously discussed, a set flag indicates that data corresponding to configuration parameters and a corresponding ECC was stored in a memory page during a previous POR. At step 814, in an embodiment, processor 202 may locate a memory page in secure memory block 610 of memory IC 602 where a copy of the configuration parameters was previously stored. At step 814, the data corresponding to the configuration parameters and the associated ECC may be copied to controller RAM 204.

At step 816, ECC engine 214 may be instructed to verify the integrity of the copied data. At step 820, as previously discussed, ECC engine 214 may utilize the previously computed ECC to correct any errors in the data corresponding to the configuration parameters. In response to determining that errors were corrected in the data, processor 202 may store corrected data corresponding to configuration parameters to a new memory page at step 820. Information of the location and identity of the new memory page may be updated in the CAM 618 for example or controller ROM 206. Separately, in an embodiment, secure memory pages in secure memory blocks 610 and 630 may be updated with corrected configuration parameters. Program control may then branch to the previously discussed step 812.

At step 816, in response to determining that the number of bits in error in the read configuration parameters exceeds the error correcting threshold of ECC engine 214, program flow may branch to step 818.

At step 818, in an embodiment, processor 202 may locate a memory page in secure memory block 630 of memory IC 604 where a copy of the configuration parameters was previously stored. At step 818, the data corresponding to the configuration parameters and the associated ECC may be copied to controller RAM 204.

At step 820, as previously discussed, ECC engine 214 may utilize the previously computed ECC to correct any errors in the data corresponding to the configuration parameters. In response to determining that errors were corrected in the data, processor 202 may store corrected data corresponding to configuration parameters to a new memory page at step 820. Information of the location and identity of the new memory page may be updated in the CAM 618 for example or controller ROM 206. Separately, in an embodiment, secure memory pages in secure memory blocks 610 and 630 may be updated with corrected configuration parameters. Program control may then branch to the previously discussed step 812.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering to the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

Associated circuitry is typically required for proper operation of the memory elements and for proper communication with the memory elements. This associated circuitry may be on the same substrate as the memory array and/or on a separate substrate. As non-limiting examples, the memory devices may have driver circuitry and control circuitry used in the programming and reading of the memory elements. Further embodiments can be envisioned by one of ordinary skill in the art after reading the foregoing. In other embodiments, combinations or sub-combinations of the above disclosed invention can be advantageously made. The block diagrams of the architecture and flow diagrams are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

We claim:

1. A method for initializing a memory system, the memory system comprising a non-volatile memory (NVM) comprising a plurality of memory pages and a read only memory (ROM), the method comprising:
    detecting a power-on reset (POR) command at the memory system;
    in response to detecting the POR command, determining whether the memory system has previously received the FOR command from a host, wherein determining if the memory system has previously received the POR command from the host comprises:
        reading a setting of a flag stored in the memory system; and determining that the memory system has previously received the POR command based on the setting of the flag;
    when it is determined that the memory system has not previously received the POR command from the host:
        reading pre-programmed configuration data from the ROM and initializing the memory system using the pre-programmed configuration data;
        generating an error correction code (ECC) for the pre-programmed configuration data; and
        storing the pre-programmed configuration data including the ECC in one of the plurality of memory pages of the NVM memory.

2. The method of claim 1, further comprising in response to determining that the memory system has previously received the POR command, locating the pre-programmed configuration data stored in the one of the plurality of memory pages of the NVM memory.

3. The method of claim 2, further comprising reading the pre-programmed configuration data and the ECC for the pre-programmed configuration data from the one of the plurality of memory pages of the NVM memory in response to locating the pre-programmed configuration data in the one of the plurality of memory pages of the NVM memory.

4. The method of claim 3, further comprising validating the pre-programmed configuration data read from the one of the plurality of memory pages of the NVM memory.

5. The method of claim 4, further comprising:
    determining that the pre-programmed configuration data read from the one of the plurality of memory pages of the NVM memory has errors;
    correcting the pre-programmed configuration data read from the one of the plurality of memory pages of the NVM memory using the ECC; and
    storing the corrected pre-programmed configuration data in another one of the plurality of memory pages of the NVM memory.

6. The method of claim 1, further comprising, setting a flag in the memory system indicating that the POR command has previously been received, in response to storing the pre-programmed configuration data including the ECC in the one of the plurality of memory pages of the NVM memory.

7. A method for initializing a memory comprising:
    performing in a memory system comprising a read only memory (ROM) and a non-volatile memory (NVM) having a plurality of memory pages the following steps:
        reading configuration data status information stored in the memory system in response to a power on reset (POR) command;
        determining from the configuration data status information whether pre-programmed configuration data is in the ROM or the NVM, wherein the configuration data status information comprises a flag and determining the pre-programmed configuration data is in the ROM or NVM is based on a setting of the flag;
        reading the pre-programmed configuration data from the NVM when the pre-programmed configuration data is determined to be in the NVM;
        determining whether there are errors in the pre-programmed configuration data based on an ECC stored with the pre-programmed configuration data; and
        configuring the memory system using the pre-programmed configuration data, when it is determined that there are no errors in the pre-programmed configuration data.

8. The method of claim 7 wherein the NVM comprises a first and second memory die and wherein reading the pre-programmed configuration data from the NVM comprises:
    reading the pre-programmed configuration data from the first memory die;
    determining whether there are errors in the pre-programmed configuration data read from the first memory die based on the ECC stored with the pre-programmed configuration data; and
    when there are errors in the pre-programmed configuration data read from the first memory die reading pre-programmed configuration data from the second memory die.

9. The method of claim 7 wherein determining the pre-programmed configuration data is in the NVM is in response to determining that the flag is set.

10. The method of claim 7 wherein determining the pre-programmed configuration data is in the ROM is in response to determining that the flag is reset.

11. The method of claim 10, further comprising:
    reading the pre-programmed configuration data from the ROM;
    verifying the pre-programmed configuration data read from the ROM;
    configuring the memory system using the pre-programmed configuration data that has been verified;

computing an ECC for the pre-programmed configuration data that has been verified; and storing the pre-programmed configuration data that has been verified data including the ECC in the NVM.

12. The method of claim 11 wherein the NVM comprises a first and second memory die and wherein storing the pre-programmed configuration data that has been verified including the ECC comprises storing the pre-programmed configuration data that has been verified and the ECC in the first memory die and in the second memory die.

13. The method of claim 11, further comprising setting the flag after storing the pre-programmed configuration data that has been verified including the ECC in the NVM.

14. The method of claim 7, further comprising:
correcting the pre-programmed configuration data using the ECC to obtain corrected pre-programmed configuration data, when it is determined that there are errors in the pre-programmed configuration data;
storing the corrected pre-programmed configuration data in the NVM; and
configuring the memory system using the corrected pre-programmed configuration data.

15. A storage device comprising:
a non-volatile memory (NVM) comprising a plurality of memory pages;
a read only memory (ROM);
a register storing a flag indicating a location of pre-programmed configuration data; and
a controller configured to, in response to a detected power on reset (POR) command:
read the flag stored in the register; and
read pre-programmed configuration data from the ROM when the flag is at a first setting, and read pre-programmed configuration data from the NVM when the flag is at a second setting.

16. The storage device of claim 15, further comprising an error correction code (ECC) engine configured to compute an ECC.

17. The storage device of claim 16, wherein when the flag is at the first setting the controller is configured to read pre-programmed configuration data from the ROM and cause the ECC engine to compute an ECC for the pre-programmed configuration data read from the ROM.

18. The storage device of claim 17, wherein the controller is further configured to update the flag stored in the register and store the pre-programmed configuration data read from the ROM and the ECC to one or more of the plurality of memory pages.

19. The storage device of claim 17 wherein the NVM comprises a first memory die and a second memory die and wherein the controller is further configured to store the pre-programmed configuration data read from the ROM and the ECC on the first memory die and on the second memory die.

20. The storage device of claim 15, wherein the NVM comprises three dimensional non-volatile memory.

21. The storage device of claim 15, further comprising:
wherein when the flag is at the second setting the controller is configured to:
read the pre-programmed configuration data from the NVM;
determine whether there are errors in the pre-programmed configuration data based on an ECC stored with the pre-programmed configuration data in the NVM; and
when it is determined that there are errors in the pre-programmed configuration data the controller is further configured to:
correct the pre-programmed configuration data using the ECC to obtain corrected pre-programmed configuration data;
store the corrected pre-programmed configuration data in the NVM; and
configure the memory system using the corrected pre-programmed configuration data.

* * * * *